(12) United States Patent
Shingai et al.

(10) Patent No.: US 10,134,971 B2
(45) Date of Patent: Nov. 20, 2018

(54) THERMOELECTRIC CONVERTER

(71) Applicant: Panasonic Intellectual Property Management Co., Ltd., Osaka (JP)

(72) Inventors: Takafumi Shingai, Kumamoto (JP); Tetsuya Nishio, Fukuoka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/497,370

(22) Filed: Apr. 26, 2017

(65) Prior Publication Data

US 2017/0365764 A1     Dec. 21, 2017

(30) Foreign Application Priority Data

Jun. 21, 2016   (JP) .................................. 2016-122654

(51) Int. Cl.
     *H01L 35/10*      (2006.01)
     *H01L 35/32*      (2006.01)
     *H01L 27/16*      (2006.01)

(52) U.S. Cl.
     CPC .............. *H01L 35/32* (2013.01); *H01L 27/16* (2013.01); *H01L 35/10* (2013.01)

(58) Field of Classification Search
     CPC ......... H01L 35/00; H01L 35/02; H01L 35/04; H01L 35/10
     See application file for complete search history.

(56) References Cited

U.S. PATENT DOCUMENTS

2014/0345666 A1* 11/2014 Konnai ................... H01L 35/08
                                                             136/230
2016/0233402 A1*  8/2016 Suda ....................... H01L 35/32

FOREIGN PATENT DOCUMENTS

JP          2002-111080       4/2002
JP          2013145848 A *  7/2013  ............. H01L 35/08

* cited by examiner

*Primary Examiner* — Christina Chern

(74) *Attorney, Agent, or Firm* — McDermott Will & Emery LLP (57) ABSTRACT

A thermoelectric converter includes a first substrate that is deformable, a second substrate that is deformable, a plurality of thermoelectric conversion elements, and a group of electrodes. The plurality of thermoelectric conversion elements are disposed between the first substrate and the second substrate. The group of electrodes electrically interconnect the plurality of thermoelectric conversion elements. The plurality of thermoelectric conversion elements are arranged in a plurality of rows. The group of electrodes include a bridge electrode disposed across a first row and a second row among the plurality of rows. The first row is adjacent to the second row. The bridge electrode has a first part whose thickness is smaller than a thickness of each of remaining electrodes other than the bridge electrode among the group of electrodes and whose surface area is larger than a surface area of each of the remaining electrodes.

6 Claims, 8 Drawing Sheets

THERMOELECTRIC CONVERTER

BACKGROUND

1. Technical Field

The present disclosure relates to a thermoelectric converter that converts heat to electricity or electricity to heat.

2. Description of the Related Art

Thermoelectric converters have been conventionally used to cool or heat objects. At present, thermoelectric converters are used to convert exhaust heat generated in factories and other facilities to electricity. A thermoelectric converter of this type includes a combination of many p-type and n-type thermoelectric conversion elements that employ a thermoelectric effect, such as the Seebeck effect, Peltier effect or Thomson effect.

Unexamined Japanese Patent Publication No. 2002-111080 discloses a thermoelectric converter in which many p-type and n-type thermoelectric conversion elements are arranged in rows between two substrates. In this configuration, these p-type and n-type thermoelectric conversion elements are electrically interconnected by a group of electrodes mounted on each substrate. Some of the electrodes are disposed across adjacent rows of thermoelectric conversion elements and each interconnect four thermoelectric conversion elements, more specifically two p-type thermoelectric conversion elements and two n-type thermoelectric conversion elements mounted thereon. Remaining electrodes are each disposed along a single row of thermoelectric conversion elements and interconnect a corresponding pair of p-type and n-type thermoelectric conversion elements in series.

SUMMARY

A thermoelectric converter of the present disclosure includes a first substrate that is deformable, a second substrate that is deformable, a plurality of thermoelectric conversion elements, and a group of electrodes. The plurality of thermoelectric conversion elements are disposed between the first substrate and the second substrate. The group of electrodes electrically interconnect the plurality of thermoelectric conversion elements. The plurality of thermoelectric conversion elements are arranged in a plurality of rows. The group of electrodes include a bridge electrode disposed across a first row and a second row of the plurality of rows. The first row is adjacent to the second row. The bridge electrode has a first part whose thickness is smaller than a thickness of each of remaining electrodes other than the bridge electrode among the group of electrodes and whose surface area is larger than a surface area of each of the remaining electrodes.

According to the thermoelectric converter of the present disclosure, both the first substrate and the second substrate are deformable. The bridge electrode has a region whose thickness is smaller than the thickness of the remaining electrodes and whose surface area is larger than the surface area of the remaining electrodes. Thus, the bridge electrode is easily bent in this region. In addition, the thermoelectric converter is easily bent along and across the gap between adjacent rows. This enables a functional surface of the thermoelectric converter to easily fit a mounting surface. Because of its larger surface area, the region of the bridge electrode which has a smaller thickness can ensure a current density substantially the same as a current density of the remaining electrodes. Consequently, the bridge electrode can reliably produce substantially the same effect as the remaining electrodes without affecting characteristics of the thermoelectric converter.

According to the thermoelectric converter of the present disclosure, as described above, the thermoelectric converter can cause its functional surface to easily fit the mounting surface without affecting characteristics of the thermoelectric converter.

Effects and significance of the present disclosure will be definite from the exemplary embodiment described below. It should be understood that the exemplary embodiment is one example for use in embodying the present disclosure and not intended to limit the present disclosure accordingly.

DETAILED DESCRIPTION OF EMBODIMENT

Prior to the description of an exemplary embodiment of the present disclosure, a problem with conventional thermoelectric converters will be described below. A thermoelectric converter is not always mounted on a flat mounting surface.

There are cases where a thermoelectric converter is mounted on a curved or other arbitrary shaped mounting surface. It is thus preferable that a thermoelectric converter can be deformed so that its functional surface fits the mounting surface. However, in the thermoelectric converter configured as in Unexamined Japanese Patent Publication No. 2002-111080, some electrodes are each disposed across adjacent rows of thermoelectric conversion elements, and remaining electrodes are each disposed along a single row of thermoelectric conversion elements. This arrangement of the thermoelectric conversion elements may inhibit the thermoelectric converter from being deformed in any given directions, including vertical and horizontal directions. Therefore, if the thermoelectric converter is mounted on a non-flat mounting surface, the functional surface may fail to fit the mounting surface. This makes it difficult for the thermoelectric converter to provide high thermoelectric conversion efficiency.

The present disclosure, which addresses the above problem, provides a thermoelectric converter that can be mounted on a non-flat mounting surface with its functional surface easily fitting this mounting surface.

Some exemplary embodiments of the present disclosure will be described below with reference to the accompanying drawings. In every drawing, X, Y, and Z axes that are orthogonal to one another are depicted, for the sake of convenience. A Z-axis direction corresponds to a height direction of thermoelectric converter 100, and the positive side of the Z axis corresponds to the upward side.

Figure 1:
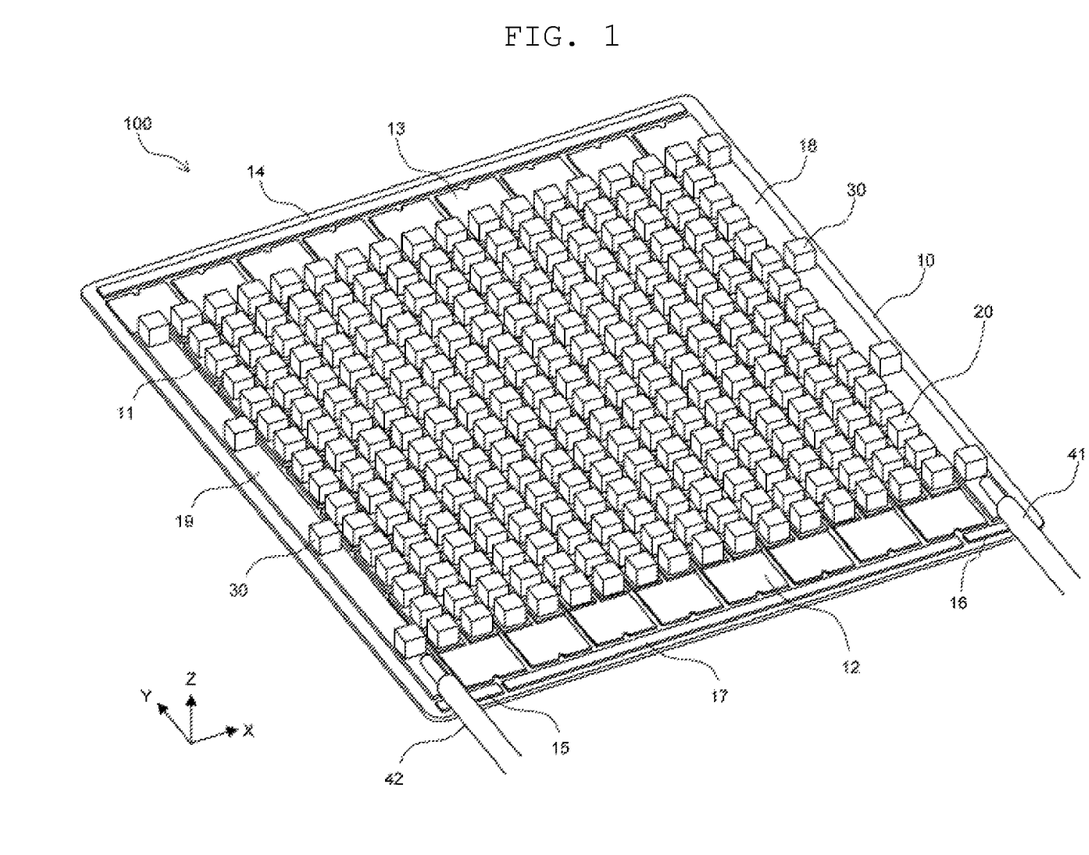
FIG. 1 is a perspective view illustrating a configuration of a thermoelectric converter according to an exemplary embodiment of the present disclosure, from which a second substrate is removed.

FIG. 1 is a perspective view illustrating a configuration of thermoelectric converter 100 from which second substrate 50 is removed.

Thermoelectric converter 100 includes first substrate 10, thermoelectric conversion elements 20, and support members 30.

First substrate 10 has a square contour with rounded corners, in plan view. First substrate 10 is made of a material having highly thermally-conductive and deformable properties. As an example, first substrate 10 may be made of a highly thermally-conductive and flexible material. First substrate 10 may be a thin copper plate. As an alternative example, first substrate 10 may be made of aluminum, a silicon resin, or an epoxy resin.

A group of electrodes including electrodes 11 and bridge electrodes 12, 13 are provided on the positive side of first substrate 10 along the Z axis, namely, on the upper surface of first substrate 10. First patterned portions 14, 15, 16, 17 and second patterned portions 18, 19 are provided on the periphery of the upper surface of first substrate 10. Each of electrodes 11, bridge electrodes 12, 13, first patterned portions 14, 15, 16, 17, and second patterned portions 18, 19 may be made of copper or aluminum, for example. If the first substrate 10 is made of an electrically-conductive material, an insulating layer needs to be formed on first substrate 10 in order to electrically insulates first substrate 10 from electrodes 11, bridge electrodes 12, 13, first patterned portions 14, 15, 16, 17, and second patterned portions 18, 19. In this case, the insulating layer may be formed between first substrate 10 and each of electrodes 11, bridge electrodes 12, 13, first patterned portions 14 to 17, and second patterned portions 18, 19.

The lower surfaces of thermoelectric conversion elements 20 are bonded to the upper surfaces of electrodes 11 and the upper surfaces of bridge electrodes 12, 13 by a solder. The lower surfaces of support members 30 are also bonded to the upper surfaces of second patterned portions 18, 19 by a solder. In addition, lead 41 is bonded to second patterned portion 18 by a solder, and lead 42 is bonded to second patterned portion 19 by a solder. However, none of thermoelectric conversion elements 20 and support members 30 is mounted on any of first patterned portions 14, 15, 16, 17.

Figure 2A:
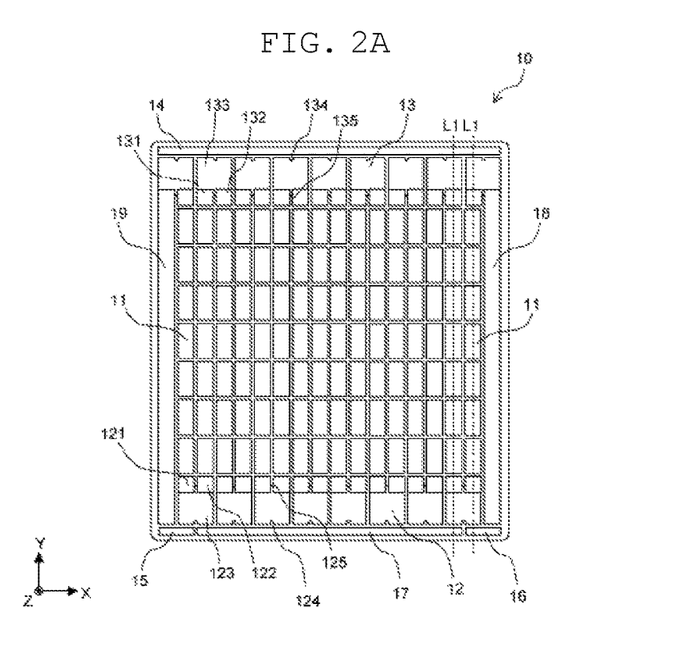
FIG. 2A is a plan view illustrating an arrangement of a group of electrodes on a first substrate in the thermoelectric converter according to the exemplary embodiment.

FIG. 2A is a plan view illustrating an arrangement of the group of electrodes and other components on first substrate 10.

Electrodes 11 are arranged in a plurality of rows L1, each of which extends in the Y-axis direction. Bridge electrodes 12 are disposed on the periphery of first substrate 10 on the negative side of the Y axis, whereas bridge electrodes 13 are disposed on the periphery of first substrate 10 on the positive side of the Y axis. Each of bridge electrodes 12 and bridge electrodes 13 is disposed across two adjacent rows L1. Each bridge electrode 12 includes electrode parts 121, 122, and 123; the electrode parts 121, 122 are interconnected by electrode part 123. Each bridge electrode 12 has notches 124, 125 formed so as to extend, in the Y-axis direction, toward the inner sides of corresponding bridge electrodes 12, in plan view. Notches 124, 125 are each formed on the line by which two corresponding adjacent rows L1 are separated from each other and extend along this line. Likewise, each bridge electrode 13 includes electrode parts 131, 132, 133 and notches 134, 135.

First patterned portion 14 is formed on the periphery of the upper surface of first substrate 10 on the positive side of the Y axis, whereas first patterned portions 15, 16, 17 are formed on the periphery on the negative side of the Y axis. All of first patterned portions 14, 15, 16, 17 extend in the X-axis direction, which is vertical to the direction in which each of the plurality of rows L1 extends. Second patterned portion 18 is formed on the periphery of the upper surface of first substrate 10 on the positive side of the X axis, whereas second patterned portion 19 is formed on the periphery of the upper surface of first substrate 10 on the negative side of the X axis. Both of second patterned portions 18, 19 extend in the Y-axis direction, which is parallel to the direction in which each of the plurality of rows L1 extends. Second patterned portion 18 on the right side is integrally connected to the rightmost bridge electrode 13, whereas second patterned portion 19 on the left side is integrally connected to the leftmost bridge electrode 13. On the upper surface of first substrate 10, the group of electrodes and the group of patterned portions are formed symmetrically in the X-axis direction.

Figure 3:
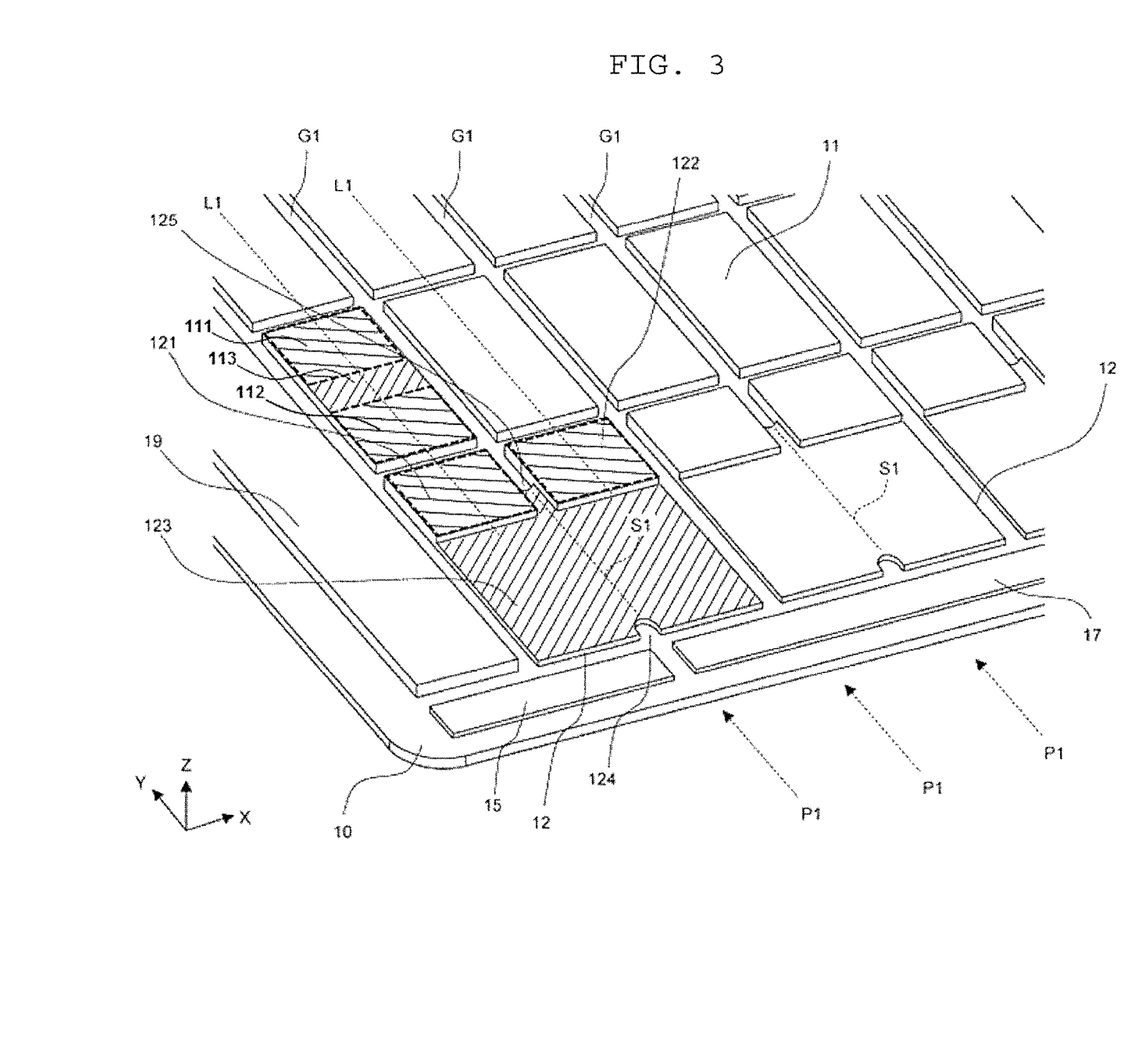
FIG. 3 is a partially enlarged view illustrating the arrangement of the group of electrodes on the first substrate in the thermoelectric converter according to the exemplary embodiment.

FIG. 3 is an enlarged view illustrating one corner of the upper surface of first substrate 10 on which the group of electrodes are arranged.

As illustrated in FIG. 3, electrode 11 has a pair of first bonding regions 111, 112 and a first non-bonding region 113 connecting between the pair of first bonding regions 111, 112. Two thermoelectric conversion elements 20 are bonded on the pair of first bonding regions 111, 112, respectively, and no thermoelectric conversion elements is bonded on the first non-bonding region 113. Bridge electrode 12 has electrode parts 121, 122, as a pair of second bonding regions, on which two thermoelectric conversion elements 20 are bonded and which have substantially the same thickness as electrodes 11. Electrode part 123, as a second non-bonding region on which no thermoelectric conversion elements is bonded, in bridge electrode 12 has a smaller thickness and a larger surface area than electrodes 11. Electrode parts 121, 122, 123 are formed integrally with one another. It is noted that, in FIG. 3, hatched areas indicate top surfaces of the pair of first bonding regions 111, 112, first non-bonding region 113, the pair of second bonding regions (electrode parts 121, 122), and second non-bonding region (electrode part 123), respectively.

Electrode parts 121, 122 have a somewhat larger square contour than thermoelectric conversion elements 20, in plan view. Electrode parts 121, 122 have the substantially the same size as electrodes 11 in the X-axis direction. Each of electrode part 121 and electrodes 11 are arrayed in the same row. Each of electrode part 122 and electrodes 11 are also arrayed in the same row. Further, electrode parts 121, 122 are linearly arrayed in the X-axis direction with gaps G1 therebetween.

Most areas of electrode parts 123 are formed so as to extend from corresponding electrode parts 121 and 122 to the negative side of the Y axis. The thickness of electrode parts 123 is determined such that their cross-sectional area cut by a plane parallel to the YZ plane and taken along a straight line S1, by which electrode parts 123 are separated into equal halves in the X-axis direction, becomes nearly equal to the cross-sectional area of electrode parts 121 or 122 or electrodes 11 which is cut by a plane parallel to the XZ plane. Notches 124, 125 are formed on the corresponding straight line S1. Each of notches 124, 125 may have a substantially semicircular shape, in plan view.

As illustrated in FIG. 3, first patterned portions 15, 17 have a little smaller thickness than electrode parts 123. First patterned portion 16 (see FIG. 2A) has substantially the same thickness as first patterned portions 15, 17. First patterned portions 15, 16, 17 are used to apply tensions to first substrate 10 when first substrate 10 is bent in a direction parallel to the XZ plane. Applying tensions to first substrate 10 enables first substrate 10 to be bent smoothly in the direction parallel to the XZ plane.

The first patterned portions 15, 16, 17 do not necessarily have to have a smaller thickness than electrode parts 123. Alternatively, the first patterned portions 15, 16, 17 may have an arbitrary thickness that allows predetermined tensions to be applied to first substrate 10. Furthermore, first patterned portions 15, 16, 17 do not necessarily have to be defined at the locations illustrated in FIGS. 2A and 3. Alternatively, first patterned portions 15, 16, 17 may be formed at any locations in the X-axis direction. The first patterned portions formed on the periphery of first substrate 10 on the negative side of the Y axis do not necessarily have to include three first patterned portions disposed in the X-axis direction. Alternatively, the first patterned portions may include an arbitrary number of first patterned portions. Moreover, a single first patterned portion may be formed on the periphery of first substrate 10 on the negative side of the Y axis, similar to first patterned portion 14 formed on the periphery of first substrate 10 on the positive side of the Y axis.

As illustrated in FIG. 3, second patterned portion 19 has substantially the same thickness as electrode parts 121, 122 and electrodes 11. Further, second patterned portion 19 has substantially the same size as electrode parts 121, 122 and electrodes 11 in the X-axis direction. In addition to the function of connecting lead 42 to thermoelectric conversion elements 20 as described above (see FIG. 1), second patterned portion 19 functions as a reinforcement member that suppresses first substrate 10 from being easily bent in directions parallel to the YZ plane.

In order to cause first substrate 10 to be easily bent in directions parallel to the YZ plane, it is necessary to decrease the thickness of second patterned portion 19 and increase the size of second patterned portion 19 in the X-axis direction. In this case, the thickness of second patterned portion 19 and the size of second patterned portion 19 in the X-axis direction may be adjusted such that the cross-sectional area of second patterned portion 19 taken along the plane parallel to the XZ plane becomes nearly equal to the cross-sectional area of electrodes 11 taken along the plane parallel to the XZ plane.

The seven bridge electrodes 13 other than those on the far right and left sides in the X-axis direction, which are illustrated in FIG. 2A, have substantially the same configuration as bridge electrodes 12 illustrated in FIG. 3. The configuration of each of these seven bridge electrodes 13 is similar to a configuration that is an inversion, in the Y-axis direction, of the configuration of bridge electrodes 12 illustrated in FIG. 3. Electrode parts 131 of the seven bridge electrodes 13 have substantially the same contour and thickness as electrode parts 121 of bridge electrodes 12; electrode parts 132 of the seven bridge electrodes 13 have substantially the same contour and thickness as electrode parts 122 of bridge electrodes 12; and electrode parts 133 of the seven bridge electrodes 13 have substantially the same contour and thickness as electrode parts 123 of bridge electrodes 12. A part of the bridge electrode 13 positioned on the far left side illustrated in FIG. 2A, which corresponds to electrode parts 131 of the seven bridge electrodes 13, is constituted by a part of second patterned portion 19. Likewise, a part of the bridge electrode 13 positioned on the far right side, which corresponds to electrode parts 132 of the seven bridge electrodes 13, is constituted by a part of second patterned portion 18.

First patterned portion 14 positioned on the positive side of the Y axis illustrated in FIG. 2A has substantially the same thickness and size as first patterned portions 15, 17 on the negative side of the Y axis illustrated in FIG. 3. Similar to first patterned portions 15, 17 positioned on the negative side of the Y axis, first patterned portion 14 positioned on the positive side of the Y axis applies tensions to first substrate 10 when first substrate 10 is bent in directions parallel to the XZ plane. First patterned portion 14 positioned on the positive side of the Y axis may include a plurality of parts that are separated from one another in the X-axis direction. Second patterned portion 18 positioned on the positive side of the X axis has substantially the same thickness and size as second patterned portion 19 positioned on the negative side of the X axis illustrated in FIG. 3.

Figure 4A:
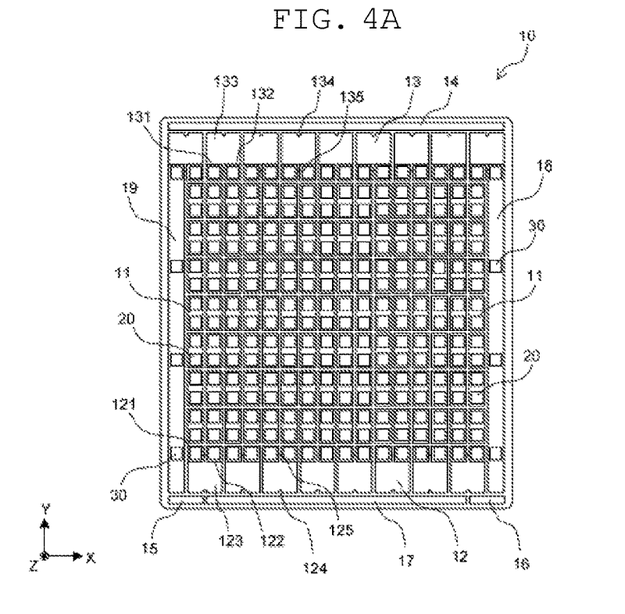
FIG. 4A is a plan view illustrating an arrangement of thermoelectric conversion elements that are mounted on the group of electrodes on the first substrate in the thermoelectric converter according to the exemplary embodiment.

FIG. 4A is a plan view illustrating an arrangement of thermoelectric conversion elements 20 mounted on the group of electrodes arranged on first substrate 10.

P-type of thermoelectric conversion elements 20 and n-type thermoelectric conversion elements 20 are mounted on electrodes 11 in an alternate manner in the Y-axis direction. P-type thermoelectric conversion element 20 is mounted on electrode part 131 of bridge electrode 13, and n-type thermoelectric conversion element 20 is mounted on electrode part 132 of bridge electrode 13. Thus, p-type and n-type thermoelectric conversion elements 20 are mounted side by side in the X-axis direction on bridge electrode 13. Four support members 30 are mounted on second patterned portion 18, and four support members 30 are also mounted on second patterned portion 19.

Each thermoelectric conversion element 20 may be substantially cubic in shape. For example, each thermoelectric conversion element 20 may be a semiconductor that converts heat to electricity. Each thermoelectric conversion element 20 may be formed by adding dopant to a material with a great figure of merit $Z$ ($=\alpha^2/\rho K$) expressed by Seebeck coefficient $\alpha$, resistivity $\rho$, and thermal conductivity $K$. Examples of this material include a $Bi_2Te_3$-based material, a lead-tellurium-based material, and a silicon-germanium-based material. By adding different dopants to the material, p-type and n-type thermoelectric conversion elements 20 can be individually formed. For example, antimony (Sb) may be doped to form p-type thermoelectric conversion element 20, and selenium (Se) may be doped to form n-type thermoelectric conversion element 20. Each thermoelectric conversion element 20 has electrodes on its upper and lower surfaces, and the electrodes are to be bonded to the group of electrodes. Each thermoelectric conversion element 20 may be a Peltier element or other element that controls heat by using electricity.

Support members 30 have substantially the same shape as thermoelectric conversion elements 20. More specifically, support members 30 may have substantially the same height as thermoelectric conversion elements 20. Each support member 30 is preferably made of a highly stiff material. Each support member 30 may be either a p-type or n-type thermoelectric conversion element 20. In this case, the material does not have to be stiff enough for a p-type or n-type thermoelectric conversion element 20 and has only to be stiff enough for an assembly. Each support member 30 may be made of a material whose upper and lower surfaces can be bonded to patterned portions on first substrate 10 and second substrate 50 by a solder. For example, each support member 30 may be made of a zinc alloy. Each support member 30 may be formed by plating the surface of an assembly made of a metal or resin material. A material for each support member 30 preferably has a high wettability for solder.

Each support member 30 may be made of a glass or resin. In this case, the upper and lower surfaces of each support member 30 may be bonded to corresponding patterned portions on first substrate 10 and second substrate 50 with an adhesive agent, instead of with solder. This adhesive agent may be made of an ultraviolet curable resin or a thermosetting resin, for example.

Second substrate 50 is attached to the assembly illustrated in FIG. 1 from the positive side of the Z axis. A group of electrodes, which are to be bonded to the upper surface of thermoelectric conversion elements 20 by a solder, are formed on the negative side of second substrate 50 along the Z axis, namely, on the lower surface of second substrate 50.

Figure 2B:
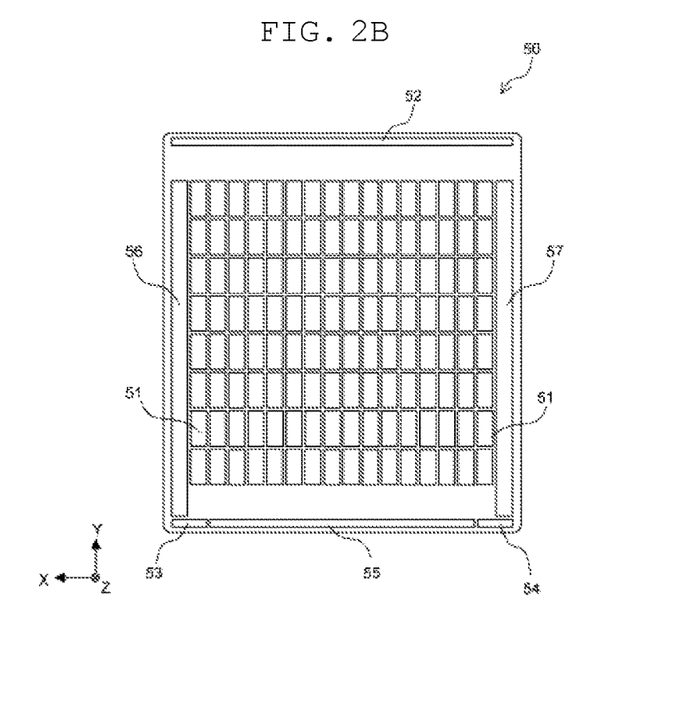
FIG. 2B is a plan view illustrating an arrangement of a group of electrodes on a second substrate in the thermoelectric converter according to the exemplary embodiment.

FIG. 2B is a plan view illustrating an arrangement of a group of electrodes on second substrate 50.

Second substrate 50 has substantially the same contour as first substrate 10, in plan view. Second substrate 50 is made of a material that is deformable and stretchable in directions parallel to the XY plane. For example, second substrate 50 may be made of a flexible, stretchable resin material.

Electrodes 51, first patterned portions 52, 53, 54, 55, and second patterned portions 56, 57 are formed on the negative side of second substrate 50 along the Z axis. Electrodes 51 have substantially the same contour and thickness as electrodes 11 of first substrate 10. First patterned portion 52 has substantially the same contour and thickness as first patterned portion 14. First patterned portion 53 has substantially the same contour and thickness as first patterned portion 16. First patterned portion 54 has substantially the same contour and thickness as first patterned portion 15. First patterned portion 55 has substantially the same contour and thickness as first patterned portion 17. Second patterned portion 56 has substantially the same contour and thickness as second patterned portions 18. Second patterned portion 57 has substantially the same contour and thickness as second patterned portions 19.

On first substrate 10, as illustrated in FIG. 2A, seven electrodes 11 are arrayed in each row L1 and in the Y-axis direction. On second substrate 50, as illustrated in FIG. 2B, eight electrodes 51 are arrayed in the Y-axis direction and along each of rows corresponding to rows L1. Positions of electrodes 51 disposed on second substrate 50 is shifted from positions of electrodes 11 disposed on first substrate 10 to the positive side of the Y axis by an amount equal to one half the size of each electrode 51 in the Y-axis direction. On second substrate 50, electrodes corresponding to bridge electrodes 12 disposed on first substrate 10 are not formed. Group of electrodes and patterned portions are disposed on the lower surface of second substrate 50 symmetrically in the X-axis direction.

Figure 4B:
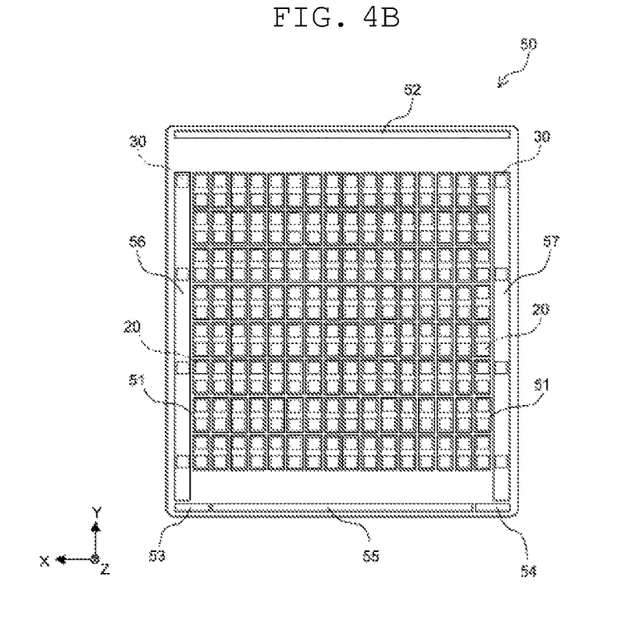
FIG. 4B is a plan view illustrating the arrangement of the thermoelectric conversion elements, relative to the arrangement of the group of electrodes on the second substrate in the thermoelectric converter according to the exemplary embodiment.

FIG. 4B is a plan view illustrating the arrangement of the thermoelectric conversion elements 20, relative to the arrangement of the group of electrodes on second substrate 50 when second substrate 50 is stacked on the assembly illustrated in FIG. 1.

P-type and n-type thermoelectric conversion elements 20 are alternately arranged, in the Y-axis direction, on corresponding electrodes 51 of second substrate 50. Four support members 30 are disposed on second patterned portion 56, whereas four support members 30 are disposed on second patterned portion 57. When second substrate 50 is stacked on the assembly illustrated in FIG. 1, the upper surfaces of thermoelectric conversion elements 20 are bonded to corresponding electrodes 51 by a solder, and the upper surfaces of support members 30 are bonded to either one of second patterned portion 56 and second patterned portion 57 by a solder.

By stacking second substrate 50 on the assembly illustrated in FIG. 1 in this manner, p-type and n-type thermoelectric conversion elements 20 mounted on first substrate 10 are interconnected in series by the group of electrodes on first substrate 10 and second substrate 50.

Figure 5:
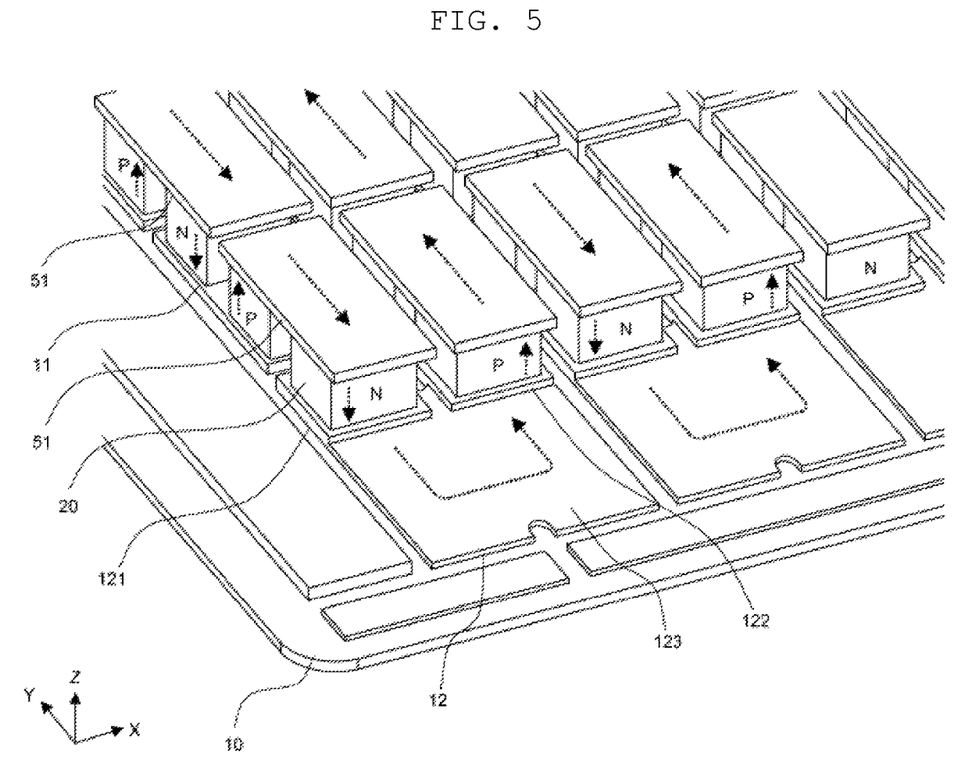
FIG. 5 is a partially enlarged view illustrating interconnections between the thermoelectric conversion elements in the thermoelectric converter according to the exemplary embodiment.

FIG. 5 is a partially enlarged view illustrating the interconnections between the thermoelectric conversion elements 20 via the group of electrodes. In FIG. 5, p-type thermoelectric conversion elements 20 are individually labeled with the alphabetic character "P", and n-type thermoelectric conversion elements 20 are individually labeled with the alphabetic character "N". The broken arrows represent an electrical connection route. In FIG. 5, support members 30 and second substrate 50 are not depicted, for the sake of convenience.

As illustrated in FIG. 5, p-type and n-type thermoelectric conversion elements 20 arrayed in the Y-axis direction are interconnected in series by electrodes 11 and electrodes 51. P-type and n-type thermoelectric conversion elements 20 that are positioned on the far negative side of the Y axis and arrayed in the X-axis direction are interconnected in series by bridge electrodes 12. Likewise, p-type and n-type thermoelectric conversion elements 20 that are positioned on the far positive side of the Y axis and arrayed in the X-axis direction are interconnected in series by bridge electrodes 13 in first substrate 10 (see FIG. 4A).

Figure 6:
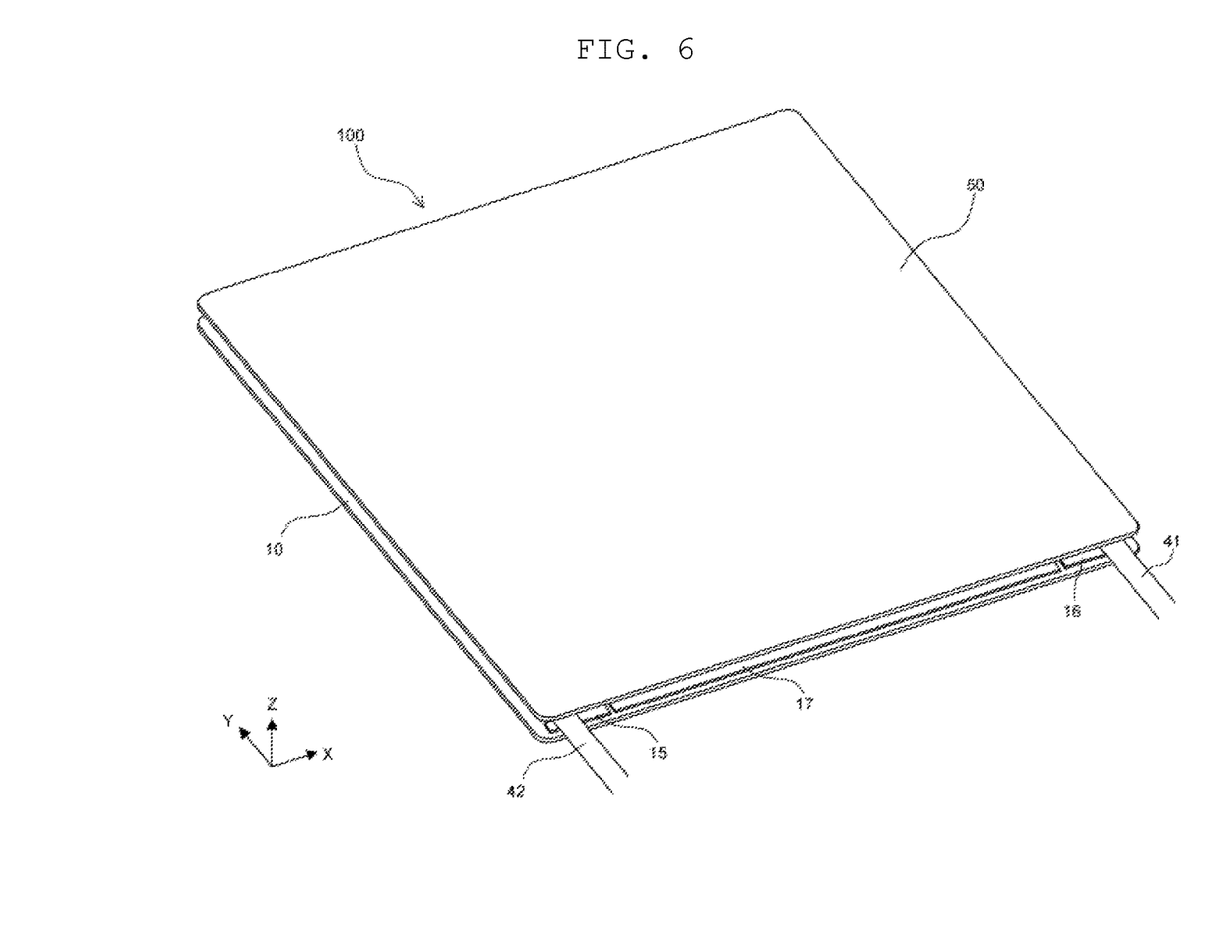
FIG. 6 is a perspective view illustrating the configuration of the thermoelectric converter according to the exemplary embodiment, to which the second substrate is attached.

FIG. 6 is a perspective view illustrating the configuration of thermoelectric converter 100 in which second substrate 50 is attached to the assembly illustrated in FIG. 1.

Thermoelectric converter 100 has a square contour with rounded corners, in plan view. Thermoelectric conversion elements 20 are arranged between first substrate 10 and second substrate 50. The distance between first substrate 10 and second substrate 50 depends on the height of thermoelectric conversion elements 20 and support members 30 disposed between first substrate 10 and second substrate 50. Support members 30 are used to reinforce thermoelectric converter 100 in the Z-axis direction. Leads 41, 42 are drawn from the inner space between first substrate 10 and second substrate 50.

Figure 7A:
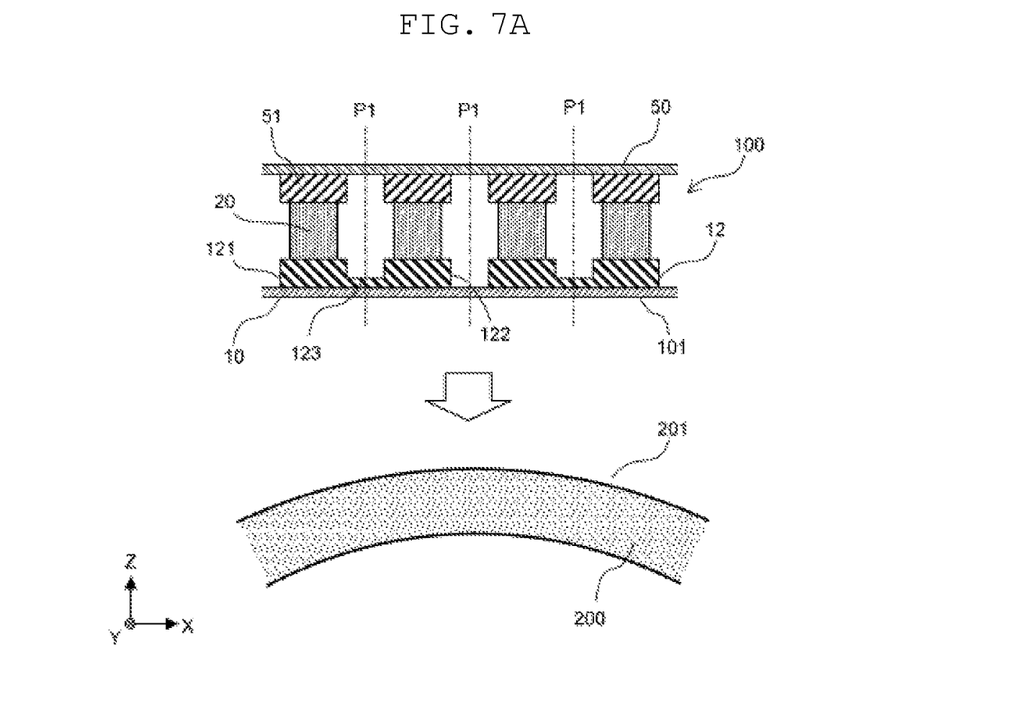
FIG. 7A is a schematic view illustrating the thermoelectric converter according to the exemplary embodiment in a state before the thermoelectric converter is mounted on a mounting surface of an object.
Figure 7B:
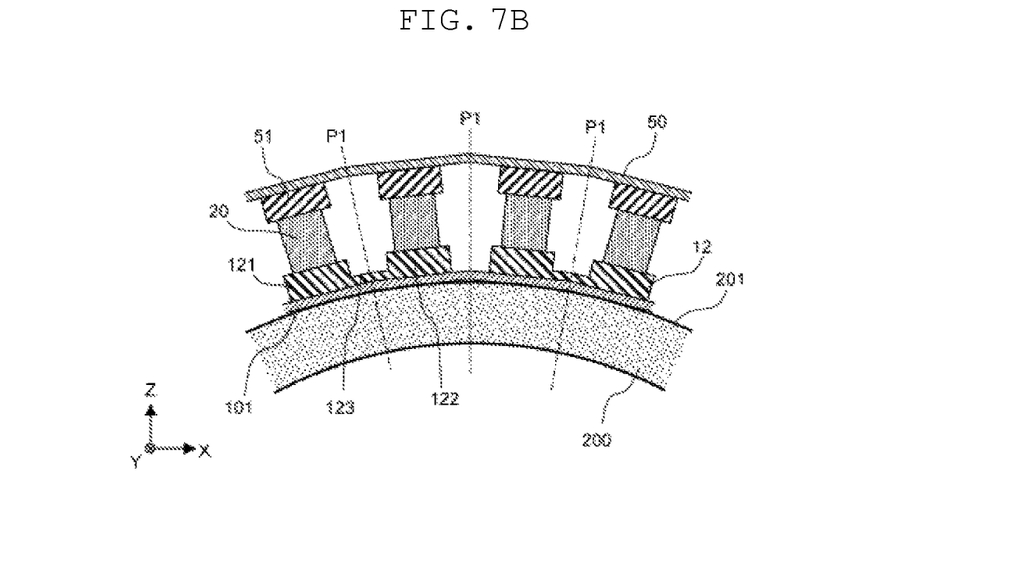
FIG. 7B is a schematic view illustrating the thermoelectric converter according to the exemplary embodiment in a state after the thermoelectric converter is mounted on the mounting surface of the object.

FIG. 7A is a schematic view illustrating thermoelectric converter 100 in a state before thermoelectric converter 100 is mounted on mounting surface 201 of object 200. FIG. 7B is a schematic view illustrating thermoelectric converter 100 in a state after thermoelectric converter 100 is mounted on mounting surface 201 of object 200.

In this exemplary embodiment, the lower surface of first substrate 10 functions as functional surface 101. When thermoelectric converter 100 is mounted on mounting surface 201 of object 200, the lower surface of first substrate 10 is brought into contact with mounting surface 201. In this case, object 200 is expected to be cylindrical in shape whose central axis is parallel to the Y axis. Therefore, mounting surface 201 is curved only in a direction parallel to the XZ plane.

When thermoelectric converter 100 that has been in the state illustrated in FIG. 7A is pressed against object 200 with functional surface 101 being in contact with mounting surface 201, thermoelectric converter 100 is bent at locations P1 in an in-plane direction of the XZ plane. As a result, as illustrated in FIG. 7B, functional surface 101 of thermoelectric converter 100 fits mounting surface 201 of object 200.

As explained with reference to FIG. 3, electrode parts 123 of bridge electrodes 12 have a smaller thickness and a larger surface area than electrodes 11. Likewise, electrode parts 133 of bridge electrodes 13 have a smaller thickness and a larger surface area than electrodes 11. Electrode parts 123, 133 configured above help the bending of bridge electrodes 12, 13. Consequently, thermoelectric converter 100 can be easily bent along gaps G1 at positions of gaps G1 each formed between adjacent rows L1 and in an in-plane direction of the XZ plane. This enables functional surface 101 of thermoelectric converter 100 to easily fit mounting surface 201 of object 200.

EFFECT OF EMBODIMENT

The above-described exemplary embodiment produces the effects described below.

Electrode parts 123 of bridge electrodes 12 and electrode parts 133 of bridge electrodes 13 have a smaller thickness and a larger surface area than electrodes 11. Electrode parts 123, 133 configured above help the bending of bridge electrodes 12, 13. Consequently, thermoelectric converter 100 can be easily bent along gaps G1 at positions P1 of gaps G1 each formed between adjacent rows L1 and in an in-plane direction of the XZ plane. This enables functional surface 101 of thermoelectric converter 100 to easily fit mounting surface 201 of object 200. Because of their large surface area, electrode parts 123 of each bridge electrode 12 which have a small thickness can ensure a current density substantially the same as that of electrodes 11. Likewise, because of their large surface area, electrode parts 133 of each bridge electrode 13 which have a small thickness can ensure a current density substantially the same as that of electrodes 51. Thus, electrode parts 123, 133 can produce the substantially the same effect as electrodes 11, 51 without affecting performances of thermoelectric converter 100. According to the foregoing exemplary embodiment, when thermoelectric converter 100 is mounted on cylindrical object 200, functional surface 101 can easily fit curved mounting surface 201 without lowing performances of thermoelectric converter 100.

According to the foregoing exemplary embodiment, electrode parts 121, 122 of bridge electrode 12 and electrode parts 131, 132 of bridge electrode 13 on which thermoelectric conversion elements 20 are mounted have substantially the same thickness as electrodes 11. Therefore, thermoelectric conversion elements 20 having the same height can be commonly mounted on all of bridge electrodes 12, 13 and electrodes 11. In other words, thermoelectric conversion elements 20 mounted on bridge electrodes 12, 13 do not have to be different in height from thermoelectric conversion elements 20 mounted on electrodes 11. Consequently, it is possible to mount thermoelectric conversion elements 20 on bridge electrodes 12, 13 and electrodes 11 with efficiency.

According to the foregoing exemplary embodiment, each bridge electrode 12 has notches 124, 125, and each bridge electrode 13 has notches 134, 135. Each of the notches 124, 125 is formed on a line by which two adjacent rows L1 are separated from each other and which extends along this line and toward the inner side of bridge electrode 12. Each of the notches 134, 135 is formed on a line by which two adjacent rows L1 are separated from each other and which extends along this line and toward the inner side of bridge electrode 13. Forming notches 124, 125, 134, 135 in this manner helps the bending of electrode parts 123, 133. Consequently, thermoelectric converter 100 can be more easily bent, thereby causing functional surface 101 to more easily fit mounting surface 201 of object 200.

According to the foregoing exemplary embodiment, first patterned portions 14, 15, 16, 17, none of which is bonded to any of thermoelectric conversion elements 20, are formed on both peripheries of first substrate 10 in the Y-axis direction so as to extend in a direction vertical to rows L1. Likewise, first patterned portions 52, 53, 54, 55 are formed on both peripheries of second substrate 50 in the Y-axis direction. Forming first patterned portions 14, 15, 16, 17, 52, 53, 54, 55 in this manner makes it possible to apply desired tensions to thermoelectric converter 100 when thermoelectric converter 100 is bent. As a result, both first substrate 10 and second substrate 50 are bent smoothly in a direction parallel to the XZ plane. This enables functional surface 101 of thermoelectric converter 100 to fit more smoothly mounting surface 201 of object 200.

According to the foregoing exemplary embodiment, second patterned portions 18, 19, none of which is bonded to any of thermoelectric conversion elements 20, are formed on both peripheries of first substrate 10 in the X-axis direction so as to extend in a direction parallel to rows L1. Likewise, second patterned portions 56, 57 are formed on both peripheries of second substrate 50 in the X-axis direction. Forming second patterned portions 18, 19, 56, 57 in this manner suppresses thermoelectric converter 100 from being bent in directions parallel to the YZ plane. This makes it possible to facilitate a process for causing functional surface 101 of thermoelectric converter 100 to fit mounting surface 201 of object 200.

Lead 41 is connected to second patterned portion 18 and further electrically connected to thermoelectric conversion elements 20 via second patterned portion 18, and lead 42 is connected to second patterned portion 19 and further electrically connected to thermoelectric conversion elements 20 via second patterned portion 19. In this way, second patterned portions 18, 19 can be used both to suppress thermoelectric converter 100 from being bent and to introduce leads 41, 42 into thermoelectric converter 100 as described above. This structure contributes to downsizing of thermoelectric converter 100.

VARIATION

In the foregoing exemplary embodiment, electrodes 51 are formed on second substrate 50. When second substrate 50 is stacked on the upper surfaces of thermoelectric conversion elements 20, electrodes 51 are bonded to the upper surfaces of thermoelectric conversion elements 20 by a solder. However, electrodes 51 do not necessarily have to be mounted on second substrate 50. Alternately, electrodes 51 may be prospectively bonded to the upper surfaces of thermoelectric conversion elements 20 by a solder.

Figure 8:
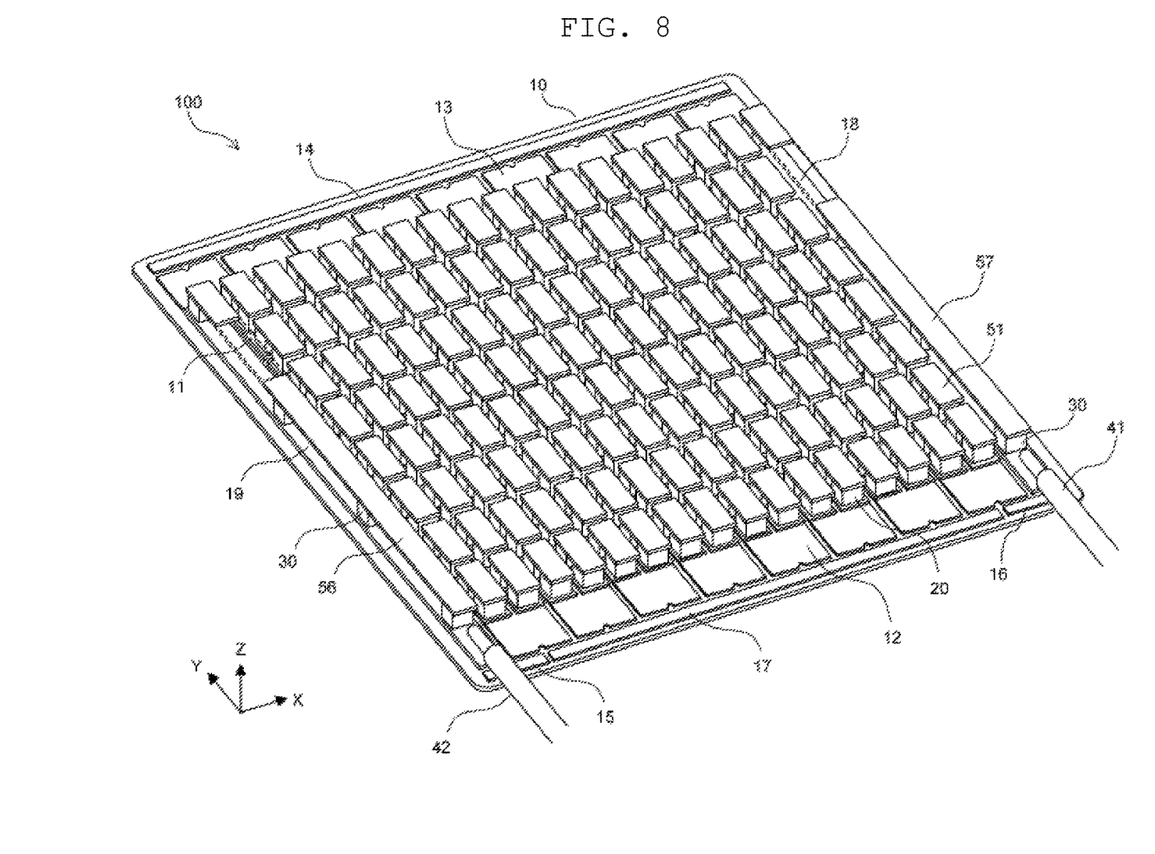
FIG. 8 is a perspective view illustrating a configuration of a thermoelectric converter according to a variation of the exemplary embodiment, from which a second substrate is removed.

FIG. 8 is a perspective view illustrating an exemplary configuration of thermoelectric converter 100 according to a variation of the exemplary embodiment, from which second substrate 50 is removed. In this variation, as illustrated in FIG. 8, electrodes 51 are prospectively bonded to the upper surfaces of thermoelectric conversion elements 20 by a solder before second substrate 50 is attached to first substrate 10. In this variation illustrated in FIG. 8, second patterned portions 56, 57 are also prospectively bonded to the upper surface of support member 30 by a solder. In FIG. 8, the portions of second patterned portions 56, 57 indicated by broken lines are not depicted, for the sake of convenience.

In this variation, second substrate 50 is not provided with electrode 51 and second patterned portions 56, 57. In addition, second substrate 50 does not necessarily have to be provided with first patterned portions 52, 53, 54.

When second substrate 50 is stacked on the upper surface of the assembly illustrated in FIG. 8, for example, second substrate 50 may be fixed to the upper surface of second patterned portion 57 positioned on the positive side of the X axis with an adhesive agent. More specifically, the periphery of second substrate 50 on the positive side of the X axis is fixed to the upper surface of second patterned portion 57 in thermoelectric converter 100 assembled as illustrated in FIG. 6, but the remaining part of second substrate 50 is not fixed to, namely, free from the upper surfaces of electrodes 51 and second patterned portion 56 positioned on the negative side of the X axis.

In this variation, except for the periphery on the one side, second substrate 50 is free from the upper surfaces of electrodes 51 and second patterned portion 56 positioned on the negative side of the X axis. Therefore, thermoelectric converter 100 according to this variation can be more easily bent in an in-plane direction of the XZ plane in FIG. 6 than thermoelectric converter 100 according to the foregoing exemplary embodiment. Consequently, when functional surface 101 is pressed against mounting surface 201 as illustrated in FIG. 7B, thermoelectric converter 100 is more easily bent, and accordingly, functional surface 101 fits mounting surface 201 more smoothly.

In this variation, there is a risk that second substrate 50 is separated from the upper surfaces of electrodes 51 in the state illustrated in FIG. 7B. In this variation, therefore, when thermoelectric converter 100 is mounted on object 200, thermoelectric converter 100 may be fixed to object 200 by an attachment, and then the upper surface of second substrate 50 may be pressed against object 200 with this attachment. This can reduce the risk of second substrate 50 being separated from the upper surfaces of electrodes 51.

In this variation, second substrate 50 is bonded to the upper surface of second patterned portion 57 with an adhesive agent. Alternatively, by applying an insulating grease to the upper surfaces of electrode 51 and second patterned portions 56, 57, second substrate 50 may be temporarily fixed to the upper surfaces of electrodes 51 and second patterned portions 56, 57 with an adhesive force of the insulating grease.

In the above case, second substrate 50 is displaceable from the upper surfaces of electrode 51 and second patterned portions 56, 57 in directions parallel to the XY plane. Therefore, thermoelectric converter 100 according to this variation can be more easily bent in an in-plane direction of the XZ plane in FIG. 6 than thermoelectric converter 100 according to the foregoing exemplary embodiment. Consequently, when functional surface 101 is pressed against mounting surface 201 as illustrated in FIG. 7B, thermoelectric converter 100 is more easily bent, and accordingly, functional surface 101 fits mounting surface 201 more smoothly.

In the foregoing exemplary configuration illustrated in FIG. 8, second patterned portions 56, 57 are disposed on the upper surfaces of support members 30. However, none of second patterned portions 56, 57 may be disposed thereon. Furthermore, second substrate 50 may be temporarily fixed to the upper surfaces of electrodes 51 and second patterned portions 56, 57 with friction between electrodes 51 and second substrate 50, instead of with grease or an adhesive agent.

In the foregoing exemplary embodiment, support members 30 are disposed between first substrate 10 and second substrate 50 together with thermoelectric conversion elements 20. However, support members 30 may be optional components. None of support members 30 may be disposed if thermoelectric converter 100 can ensure a sufficient strength in the Z-axis direction.

In the foregoing exemplary embodiment, first patterned portions 52, 53, 54, 55 are provided in second substrate 50. However, none of first patterned portions 52, 53, 54, 55 may be provided in second substrate 50 if thermoelectric converter 100 can be bent sufficiently smoothly. Alternately, first patterned portions 52, 53, 54, 55 may be provided in second substrate 50, but none of first patterned portions 14, 15, 16, 17 may be provided in first substrate 10. This means that first patterned portions 14, 15, 16, 17 and first patterned portions 52, 53, 54, 55 may be optional components. None of first patterned portions 14, 15, 16, 17 and first patterned portions 52, 53, 54, 55 may be provided if functional surface 101 can fit the mounting surface sufficiently smoothly.

In the foregoing exemplary embodiment, second patterned portions 56, 57 are provided in second substrate 50. However, none of second patterned portions 56, 57 may be provided in second substrate 50 if it is possible to control the bending of thermoelectric converter 100 in directions parallel to the YZ plane. Furthermore, by decreasing the thicknesses of second patterned portions 18, 19 on first substrate 10 and second patterned portions 56, 57 on second substrate 50, as described above, thermoelectric converter 100 may be more easily bent or deformed in directions parallel to the YZ plane. Alternatively, by not providing second patterned portions 18, 19 on first substrate 10 and second patterned portions 56, 57 on second substrate 50, thermoelectric converter 100 may be more easily bent or deformed in directions parallel to the YZ plane. If second patterned portions 18, 19, 56, 57 are not provided, for example, leads 41, 42 may be connected to bridge electrodes 13 on the far right and left sides illustrated in FIG. 2A. In this case, bridge electrodes 13 on the far right and left sides may have substantially the same thickness and area as electrodes 11.

In the foregoing exemplary embodiment, as illustrated in FIG. 3, the thickness of electrode parts 121, 122 is set to be substantially the same as the thickness of electrodes 11.

However, the thickness of electrode parts 121, 122 may be set to be substantially the same as the thickness of electrode parts 123. In this case, since the thickness of electrode parts 121, 122 may be smaller than the thickness of electrodes 11, thermoelectric conversion elements 20 mounted on electrode parts 121, 122 need to be positioned at a height greater than thermoelectric conversion elements 20 mounted on electrode 11 by an amount equal to the difference in thickness. As a result, thermoelectric conversion elements 20 having different sizes need to be mounted on electrodes 11 and bridge electrodes 12. This may result in decreased productivity. Thus, in order to mount thermoelectric conversion elements 20 with efficiency, the thickness of electrode parts 121, 122 may be preferably set to substantially the same as the thickness of electrodes 11.

In the foregoing exemplary embodiment, the group of electrodes are laid out such that all of bridge electrodes 12, 13 are disposed on first substrate 10. However, the group of electrodes may be laid out such that bridge electrodes 12 or 13 or all of bridge electrodes 12, 13 are disposed on second substrate 50. Moreover, the contours of electrodes 11 and bridge electrodes 12, 13 and the areas and contours of electrode parts 123, 133 in plan view may also be modified as appropriate.

In addition to the above, the exemplary embodiment of the present disclosure may be modified as appropriate in various ways within the scope of the technical idea described in the claims.

What is claimed is:

1. A thermoelectric converter comprising:
   a first substrate that is deformable;
   a second substrate that is deformable;
   a plurality of thermoelectric conversion elements disposed between the first substrate and the second substrate; and
   a group of electrodes that electrically interconnect the plurality of thermoelectric conversion elements, wherein:
   the plurality of thermoelectric conversion elements are bonded to the group of electrodes, respectively,
   the plurality of thermoelectric conversion elements are arranged in a plurality of rows including a first row and a second row, the first row being adjacent to the second row, the plurality of rows extending in a same extending direction,
   the group of electrodes includes a first electrode and a second electrode having a different shape from the first electrode, the first electrode electrically interconnecting between two of the plurality of thermoelectric conversion elements in the first row, the second electrode electrically interconnecting between one of the plurality of thermoelectric conversion elements in the first row and one of the plurality of thermoelectric conversion elements in the second row,
   the first electrode has a pair of first bonding regions and a first non-bonding region connecting the pair of first bonding regions, the two of the plurality of thermoelectric conversion elements in the first row being bonded on the pair of first bonding regions, respectively, none of the plurality of thermoelectric conversion elements being bonded on the first non-bonding region,
   the second electrode has a pair of second bonding regions and a second non-bonding region connecting the pair of second bonding regions, the one of the plurality of thermoelectric conversion elements in the first row and the one of the plurality of thermoelectric conversion elements in the second row being bonded on the pair of second bonding regions, respectively, none of the plurality of thermoelectric conversion elements being bonded on the second non-bonding region,
   a thickness of the second non-bonding region of the second electrode in a first direction is smaller than a thickness of the first non-bonding region of the first electrode in the first direction, the first direction being perpendicular to a surface of the second electrode on which the one of the plurality of thermoelectric conversion elements is bonded, and
   a surface area of the second non-bonding region of the second electrode is larger than a surface area of the first non-bonding region of the first electrode.

2. The thermoelectric converter according to claim 1, wherein a thickness of each of the pair of second bonding regions of the second electrode in the first direction is substantially the same as a thickness of each of the pair of first bonding regions of the first electrode in the first direction.

3. The thermoelectric converter according to claim 1, wherein the second electrode has a notch formed on an edge of the second non-bonding region inbetween the first and second rows, the notch extending from the edge towards a center of the second electrode.

4. The thermoelectric converter according to claim 1, wherein:
   a first patterned portion is provided on a portion of a periphery of at least one of the first substrate and the second substrate, the first patterned portion being not electrically connected to any of the plurality of thermoelectric conversion elements, the first patterned portion extending in a direction perpendicular to the extending direction of each of the plurality of rows, and
   a second patterned portion is provided on another portion of the periphery of at least one of the first substrate and the second substrate, the second patterned portion being electrically connected to one of the plurality of thermoelectric conversion elements, the second patterned portion extending in a direction parallel to the extending direction of each of the plurality of rows.

5. The thermoelectric converter according to claim 1, wherein a patterned portion is provided on a portion of a periphery of at least one of the first substrate and the second substrate, the patterned portion being electrically connected to one of the plurality of thermoelectric conversion elements, the patterned portion extending in a direction parallel to the extending direction of each of the plurality of rows.

6. The thermoelectric converter according to claim 5, wherein the patterned portion is connected to a lead, the lead being electrically connected to the one of the plurality of thermoelectric conversion elements via the patterned portion.

* * * * *